(12) United States Patent
Yao et al.

(10) Patent No.: US 6,407,630 B1
(45) Date of Patent: Jun. 18, 2002

(54) DC OFFSET CANCELLING CIRCUIT APPLIED IN A VARIABLE GAIN AMPLIFIER

(75) Inventors: Chi-Tai Yao, Kaohsiung Hsien; Wei-Chen Shen; Hung-Chih Liu, both of Hsinchu, all of (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 0 days.

(21) Appl. No.: 09/754,168

(22) Filed: Jan. 4, 2001

(51) Int. Cl.[7] .................................................. H03F 1/02
(52) U.S. Cl. ............................ 330/9; 330/51; 327/124
(58) Field of Search ............................. 330/9, 51, 69; 327/124, 307

(56) References Cited

U.S. PATENT DOCUMENTS

| | | | | |
|---|---|---|---|---|
| 5,361,042 A | * | 11/1994 | Gist | 330/9 |
| 6,005,431 A | * | 12/1999 | Mehr et al. | 327/307 |
| 6,208,209 B1 | * | 3/2001 | Ng | 330/279 |
| 6,239,654 B1 | * | 5/2001 | Yamamoto | 330/9 |

OTHER PUBLICATIONS

"A Direct–Conversion Receiver for 900 MHz (ISM Band) Spread–Spectrum Digital Cordless Telephone", IEEE Journal of Solid–State Circuits, vol. 31, No. 12, Dec. 1996, pp. 1955–1963.
"A 2 GHz Wide–Band Direct Conversion Receiver for WCDMA Applications", IEEE Journal of Solid–State Circuits, vol. 34, No. 12, Dec., 1999, pp. 1893–1903.

* cited by examiner

Primary Examiner—Robert Pascal
Assistant Examiner—Khanh Van Nguyen
(74) Attorney, Agent, or Firm—Woodcock Washburn LLP

(57) ABSTRACT

The present invention discloses a DC offset canceling circuit applied in a variable gain amplifier. The DC offset canceling circuit comprises a transconductance amplifier and at least one internal capacitor to function as a filter. The input of the transconductance amplifier is electrically connected to the output of the variable gain amplifier, and the output of the transconductance amplifier and the at least one internal capacitor are electrically connected to the input of the variable gain amplifier to form a feedback loop. To cooperate with the function of the DC offset cancelation, the input stage of the variable gain amplifier comprises an auxiliary differential pair.

3 Claims, 5 Drawing Sheets

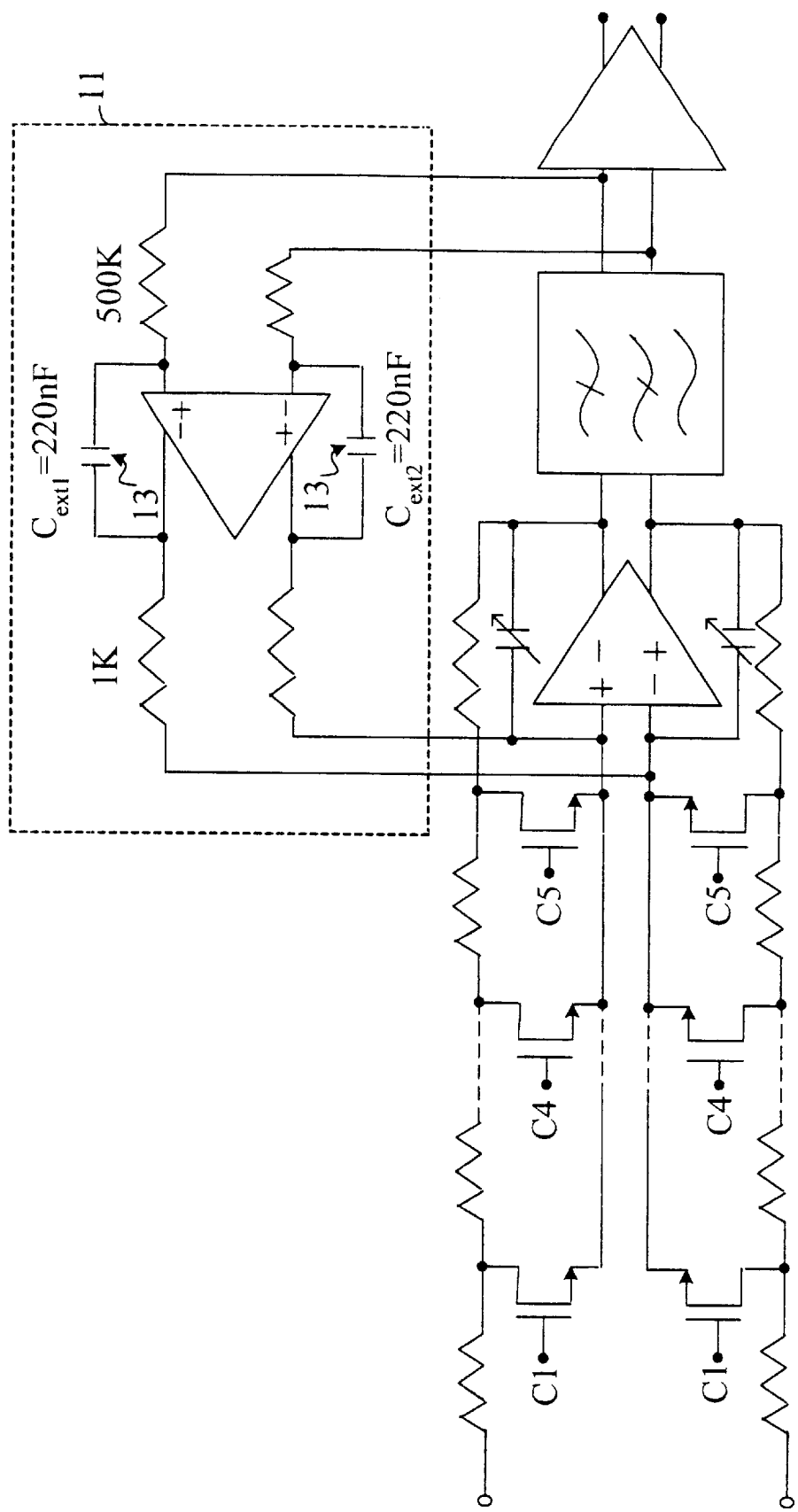
FIG. 1 (a) (PRIOR ART)

DC OFFSET CANCELLING CIRCUIT APPLIED IN A VARIABLE GAIN AMPLIFIER

BACKGROUND OF THE INVENTION

1. Field of the Invention

The present invention relates to a DC offset canceling circuit applied in a variable gain amplifier, and particularly to a DC offset canceling circuit which uses internal capacitors inside an IC for generating a filtering function.

2. Description of Related Art

Variable gain amplifiers (VGA), which amplify input signals to necessary voltage levels of a system in demodulation process, are largely used in home network transceivers which transmit signals via cables. When the variable gain amplifier is used, a differential input end of an internal operational amplifier has the problem of intrinsic offset, and the intrinsic offset is always in the range of several mV to tens of mV. For wireless or wire communication, the maximum gain of the variable gain amplification is up to tens of dB; therefore, the intrinsic offset after amplification will affect the recovery ability of the received signal the characteristics of parameters of a dynamic range and signal noise ratio. A DC offset canceling circuit is shown in FIG. 1 (a), disclosed by A. Parssinen et al., in "A 2-GHz Wide-Band Direct Conversion Receiver for WCDMA Application," IEEE J.Solid-State Circuits, Vol. 34, pp. 1893–1903, December 1999. In FIG. 1, a closed loop feedback path 11 is formed by an operational amplifier, resistors and capacitors to cancel the intrinsic offset. Since the closed loop feedback path 11 executes the function of a low pass active-RC filter, the capacitors $C_{ext}$ 13 are huge and have to be put outside the chip. For designing a chip, it is necessary to provide more I/O pins to electrically connect to the external capacitors $C_{ext}$ 13. Consequently, both the design complexity and cost are increased.

Another prior art DC offset canceling circuit is shown in FIG. 1(b), disclosed by C. Dennis Hull et al., in "A Direct Conversion Receiver for 900 MHz (ISM Band) Spread-Spectrum Digital Cordless Telephone," IEEE J. Solid-State Circuits, Vol. 31, No. 12, pp. 1955–1963, December 1996. The circuit is formed by cascading an operational amplifier, resistors and capacitors, and a closed loop feedback path 12 is formed to cancel the intrinsic offset. As mentioned above, the external capacitors $C_{ext}$ 13 contained in the closed loop feedback path 12 are huge and must be put outside the chip. For designing a chip, it is necessary to provide more I/O pins to electrically connect to the external capacitors. Consequently, both the design complexity and cost are increased.

SUMMARY OF THE INVENTION

A first object of the present invention is to cancel the intrinsic offset of a variable gain amplifier.

A second object of the present invention is to provide a DC offset canceling circuit having less I/O pins.

A third object of the present invention is to provide a simplified DC offset canceling circuit at a lower cost.

For achieving the above objects, the present invention proposes a DC offset canceling circuit applied in a variable gain amplifier, which comprises a transconductance amplifier and at least one internal capacitor to function as a filter. The input of the transconductance amplifier is electrically connected to the output of the variable gain amplifier, and the output of the transconductance amplifier and the at least one internal capacitor are electrically connected to the input of the variable gain amplifier to form a feedback loop. To cooperate with the function of the DC offset cancelation, the input stage of the variable gain amplifier comprises an auxiliary differential pair.

The DC offset canceling circuit applied in a variable gain amplifier according to the present invention comprises a transconductance amplifier, at least one internal capacitor and an auxiliary differential pair. The transconductance amplifier is electrically connected to the output of the variable gain amplifier for transforming an input voltage to an output current based on a ratio. The at least one internal capacitor is electrically connected to the output of the transconductance amplifier for generating a filtering function by working together with the transconductance amplifier. The auxiliary differential pair is situated at the input of the variable gain amplifier and electrically connected to the output of the transconductance amplifier to function as a current switch. Besides, the variable gain amplifier comprises a first amplifier to function as an input stage, and the auxiliary differential pair is embedded in the input end of the first amplifier. The transconductance amplifier and the at least one internal capacitor are embedded in a chip.

BRIEF DESCRIPTION OF THE DRAWINGS

The present invention will be described according to the appended drawings in which.

PREFERRED EMBODIMENT OF THE PRESENT INVENTION

Figure 1B:
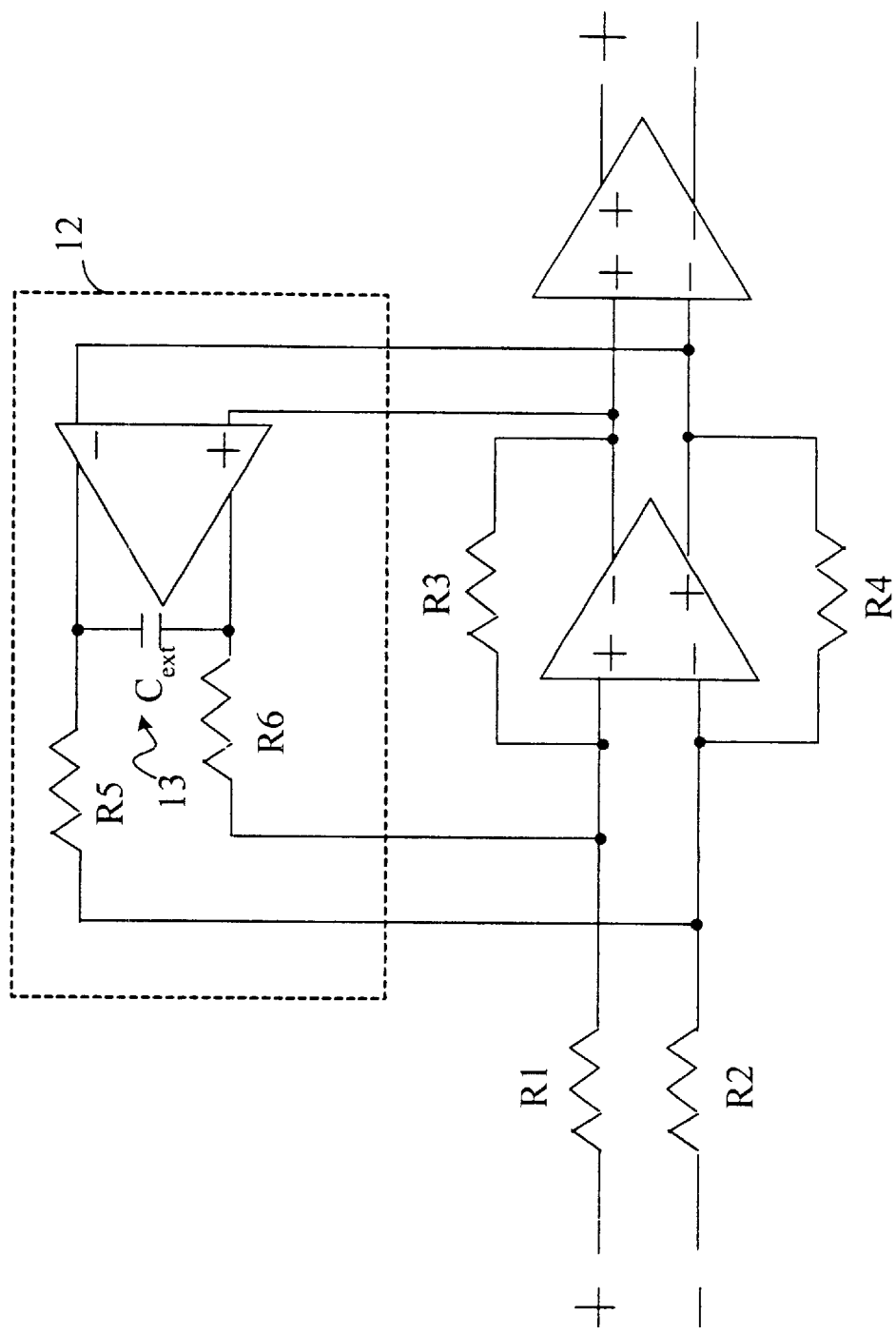
FIGS. 1(a) and (b) show prior art DC offset canceling circuits applied in a variable gain amplifier.
Figure 2:
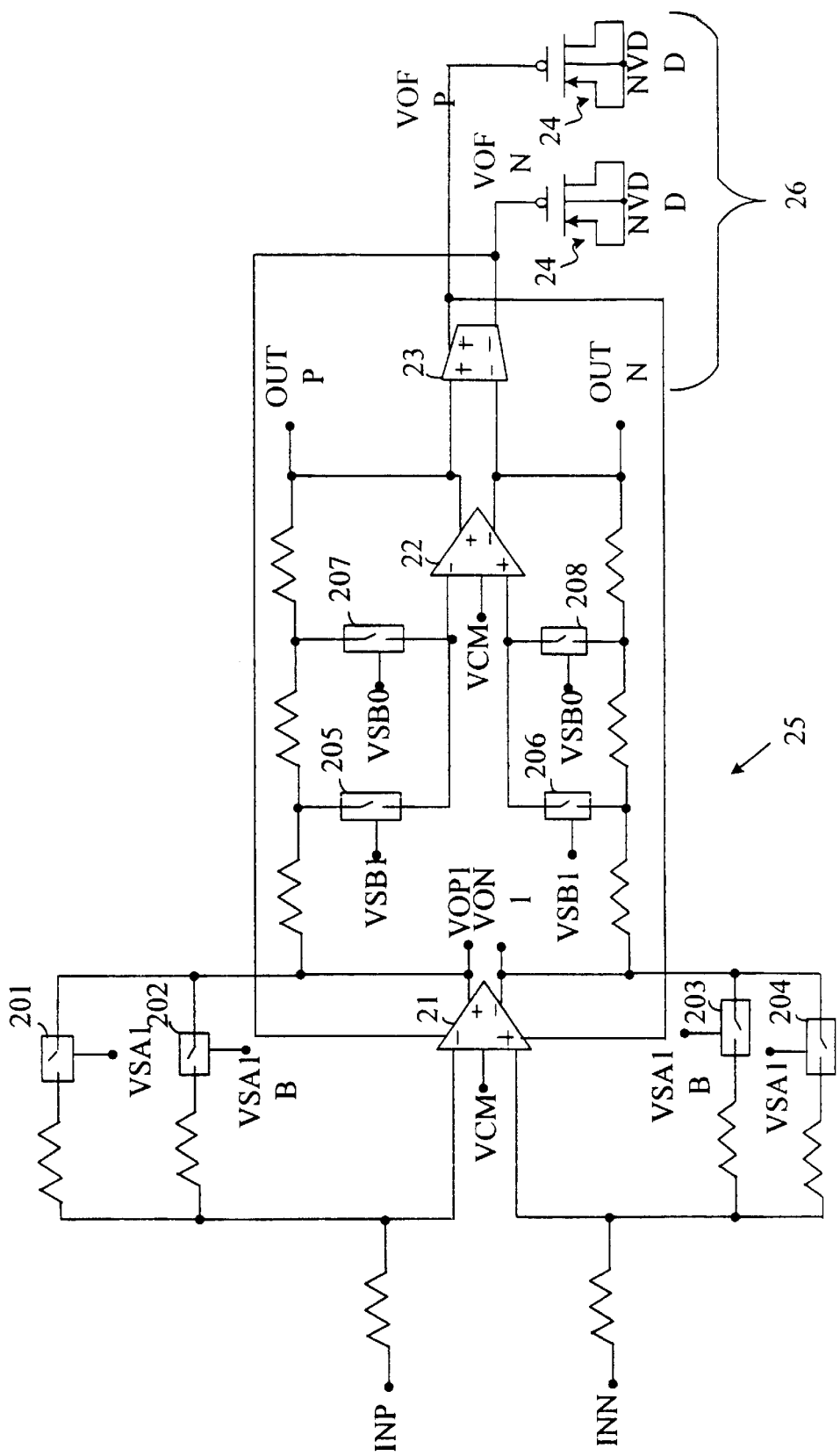
FIG. 2 shows a DC offset canceling circuit applied in a variable gain amplifier according to the present invention.

FIG. 2 shows a DC offset canceling circuit 26 applied in a variable gain amplifier 25 according to the present invention. The variable gain amplifier 25 includes a first amplifier 21, a second amplifier 22, a plurality of switches 201~208, and a plurality of resistors. The DC offset canceling circuit 26 includes a transconductance amplifier 23 and at least one internal capacitor 24. The switches 201~204 are used to adjust the variable gain of the first amplifier 21. For example, if the switch 201 is closed, then the gain will be raised; and if the switch 202 is closed, then the gain will be reduced. The switches 205~208 are used to adjust the variable gain of the second amplifier 22. For example, if the switch 205 is closed, then the gain will be raised; and if the switch 207 is closed, then the gain will be reduced. The transconductance amplifier 23 is used to transform the output voltage of the second amplifier 22 to an output current based on a ratio. The output of the transconductance amplifier 23 is coupled to at least one internal capacitor 24, and then is fed back to the input of the first amplifier 21 for canceling the DC offset of the variable gain amplifier. The transconductance amplifier 23 is cooperated with the internal capacitors 24, only about 10 pF or even under 10 pF, as a Gm-C filter. Since the capacitance of the internal capacitors 24 is small, the internal capacitors 24 can be manufactured easily inside an IC, and do not occupy I/O pins.

Figure 3:
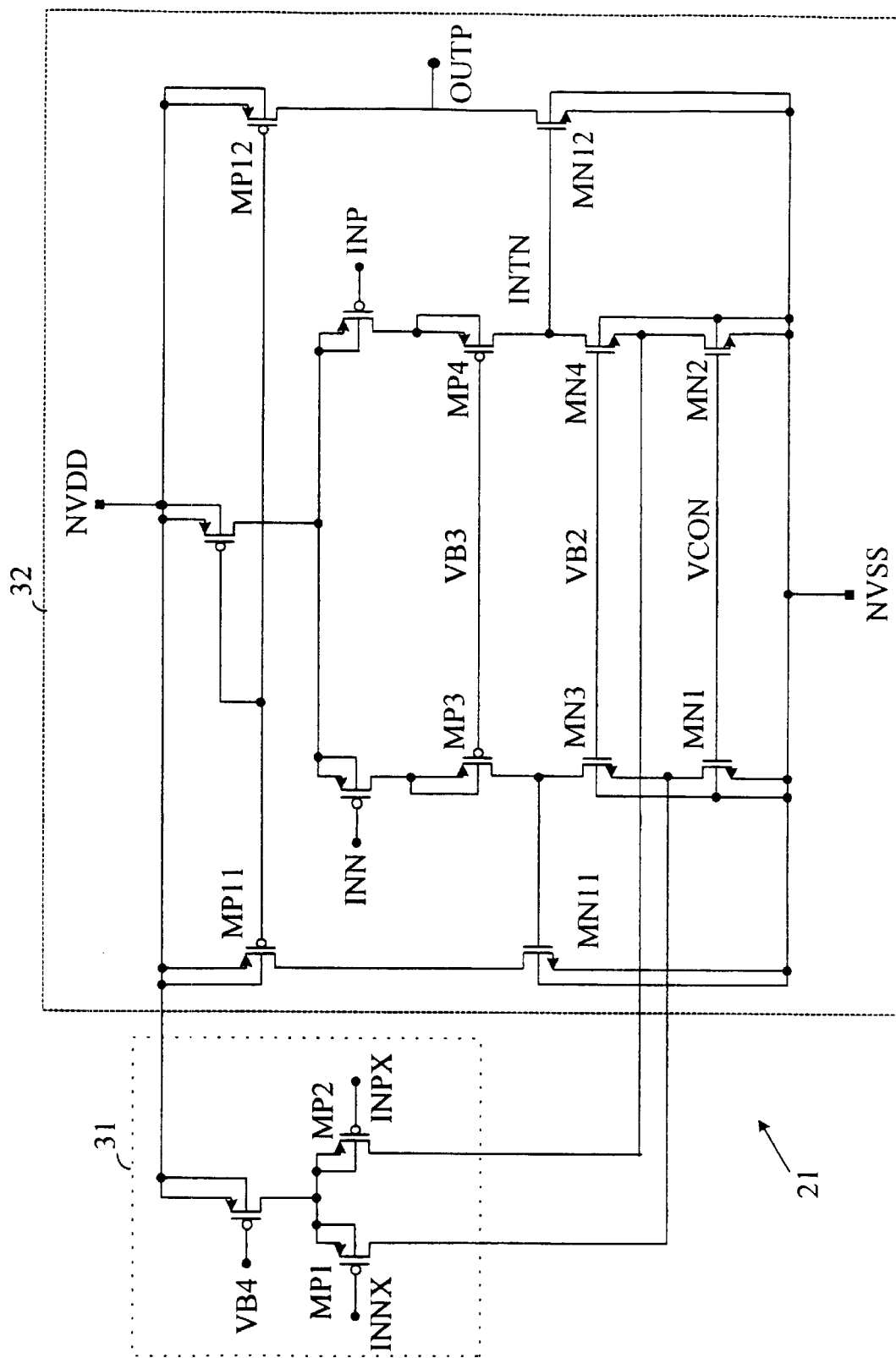
FIG. 3 shows a first amplifier containing a n auxiliary differential pair according to the present invention.

FIG. 3 shows a first amplifier 21 containing an auxiliary differential pair according to the present invention. The first amplifier 21 is formed by cascading a well-known amplifier circuit 32 and an auxiliary differential pair 31 whose inputs INNX and INPX are electrically connected to the output of the transconductance amplifier 23.

Figure 4:
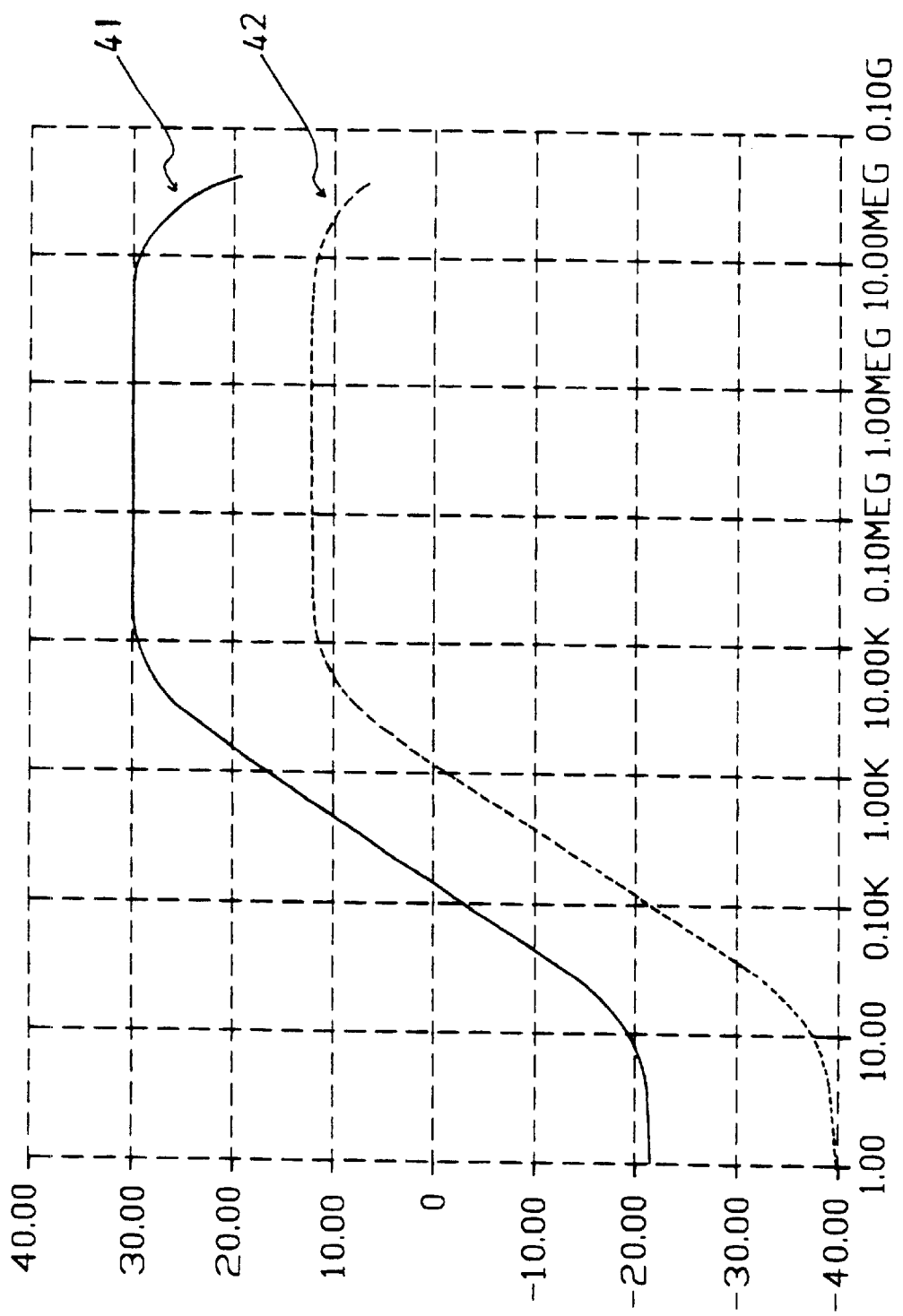
FIG. 4 shows a simulation diagram of frequency responses according to the present invention.

FIG. 4 shows a simulation diagram of frequency responses according to the present invention. A first curve 41 is the frequency response of the variable gain amplifier 25, and a second curve 42 is the frequency response of the first amplifier 21. In FIG. 4, it is shown that the transconductance amplifier 23 cooperated with the internal capacitors 24 can generate a 10 MHz bandwidth.

The above-described embodiments of the present invention are intended to be illustrated only. Numerous alternative embodiments may be devised by those skilled in the art without departing from the scope of the following claims.

What is claimed is:

1. A DC offset canceling circuit applied in a variable gain amplifier, comprising:

a transconductance amplifier electrically connected to the output of the variable gain amplifier for transforming an input voltage to an output current based on a ratio;

at least one internal capacitor electrically connected to the output of said transconductance amplifier for generating a low-pass filtering function by working together with said transconductance amplifier; and an auxiliary differential pair situated at the input of said variable gain amplifier and electrically connected to the output of said transconductance amplifier.

2. The DC offset canceling circuit applied in a variable gain amplifier of claim 1, wherein said variable gain amplifier comprises a first amplifier as an input stage, and said auxiliary differential pair is embedded in the input stage of said first amplifier.

3. The DC offset canceling circuit applied in a variable gain amplifier of claim 1, wherein said transconductance amplifier and said at least one internal capacitor are embedded in a chip.

* * * * *